United States Patent [19]

Rogers

[11] Patent Number: 5,365,179
[45] Date of Patent: Nov. 15, 1994

[54] APPARATUS AND METHOD FOR MEASURING GROUND IMPEDANCE

[75] Inventor: Wesley A. Rogers, Grosse Pointe Park, Mich.

[73] Assignee: Electronic Development, Inc., Grosse Pointe Park, Mich.

[21] Appl. No.: 854,313

[22] Filed: Mar. 19, 1992

[51] Int. Cl.$^5$ .............................................. G01R 31/02
[52] U.S. Cl. ..................................... 324/650; 324/713; 324/509
[58] Field of Search ............... 324/602, 605, 649, 650, 324/509, 510, 525, 713, 715; 364/480-484, 492

[56] References Cited

U.S. PATENT DOCUMENTS

| H330 | 9/1987 | Burich et al. | 324/500 |
|---|---|---|---|
| 1,775,502 | 9/1930 | Schleicher et al. | 324/713 |
| 2,337,962 | 12/1943 | Atkinson | 324/713 |
| 3,783,340 | 1/1974 | Becker | 317/18 B |
| 3,891,895 | 6/1975 | Wittlinger | 317/18 D |
| 3,938,006 | 2/1976 | Gadwal et al. | 317/18 C |
| 3,996,496 | 12/1976 | Volk, Jr. | 317/18 B |
| 4,114,089 | 9/1978 | Ahmed | 324/51 |
| 4,153,923 | 5/1979 | Graf | 361/48 |
| 4,200,835 | 4/1980 | Anahara et al. | 324/51 |
| 4,228,475 | 10/1980 | Sherwood | 361/47 |
| 4,368,498 | 1/1983 | Neuhouser | 361/48 |
| 4,419,766 | 12/1983 | Goeken et al. | 455/62 |
| 4,529,929 | 7/1985 | Berggren | 324/52 |
| 4,736,157 | 4/1988 | Betker et al. | 324/62 |
| 4,800,374 | 1/1989 | Jacobson | 340/649 |
| 4,857,830 | 8/1989 | Matsuno | 324/62 |
| 4,866,391 | 9/1989 | Latham, Jr. | 324/509 |
| 4,991,105 | 2/1991 | Pimental | 364/483 |

FOREIGN PATENT DOCUMENTS 2514902 4/1983 France .................. 324/650

OTHER PUBLICATIONS

Operating Manual For The Model 3577A Network Analyzer and Model 35677A/B S Parameter Test Set, Chapter 3, pp. 3–1 to 3–38, Hewlett Packard (1983) (no month).

Mardiguian, *Grounding and Bonding*, Chapter 2, pp. 2.1–2.7 and Chapter 10, pp. 10.20 to 10.27 (1988) (no month).

Plumey et al., "High Frequency Harmonic Input Impedance of an Antenna Embedded In a Conducting Half Space", *Electromagnetic Compatibility*, 1983, (no month), Proceedings, pp. 45–50.

Plumey et al., "Impedance Haute Frequence D'Une Antenne Deposec Dans Un Demi (Espace Conducteur", *Compatibilite Electromagnetique*, Tregastel 1983, (no month), pp. C5-1 to C5-6.

Anderson "S–Parameter Techniques For Faster, More Accurate Network Design", Hewlett Packard Application, Note 95-1 (1967) (no month).

*Primary Examiner*—Maura K. Regan
*Attorney, Agent, or Firm*—Davis Hoxie Faithfull & Hapgood

[57] ABSTRACT

A method and apparatus for measuring ground to earth impedance at frequencies above dc. A computer controlled instrument is provided for implementing a Three Point Measurement or a Fall of Potential method using three ground paths and a plurality of discrete frequencies in the range of from 5 Hz to 200 MHz. The complex impedance vector array, including absolute value and phase angle, and the real and complex components, for each frequency selected in the range may be determined. The acquired data is evaluated to identify antenna effects to improve the quality of the ground and to select the better ground path.

49 Claims, 8 Drawing Sheets

Microfiche Appendix Included
(1 Microfiche, 54 Pages)

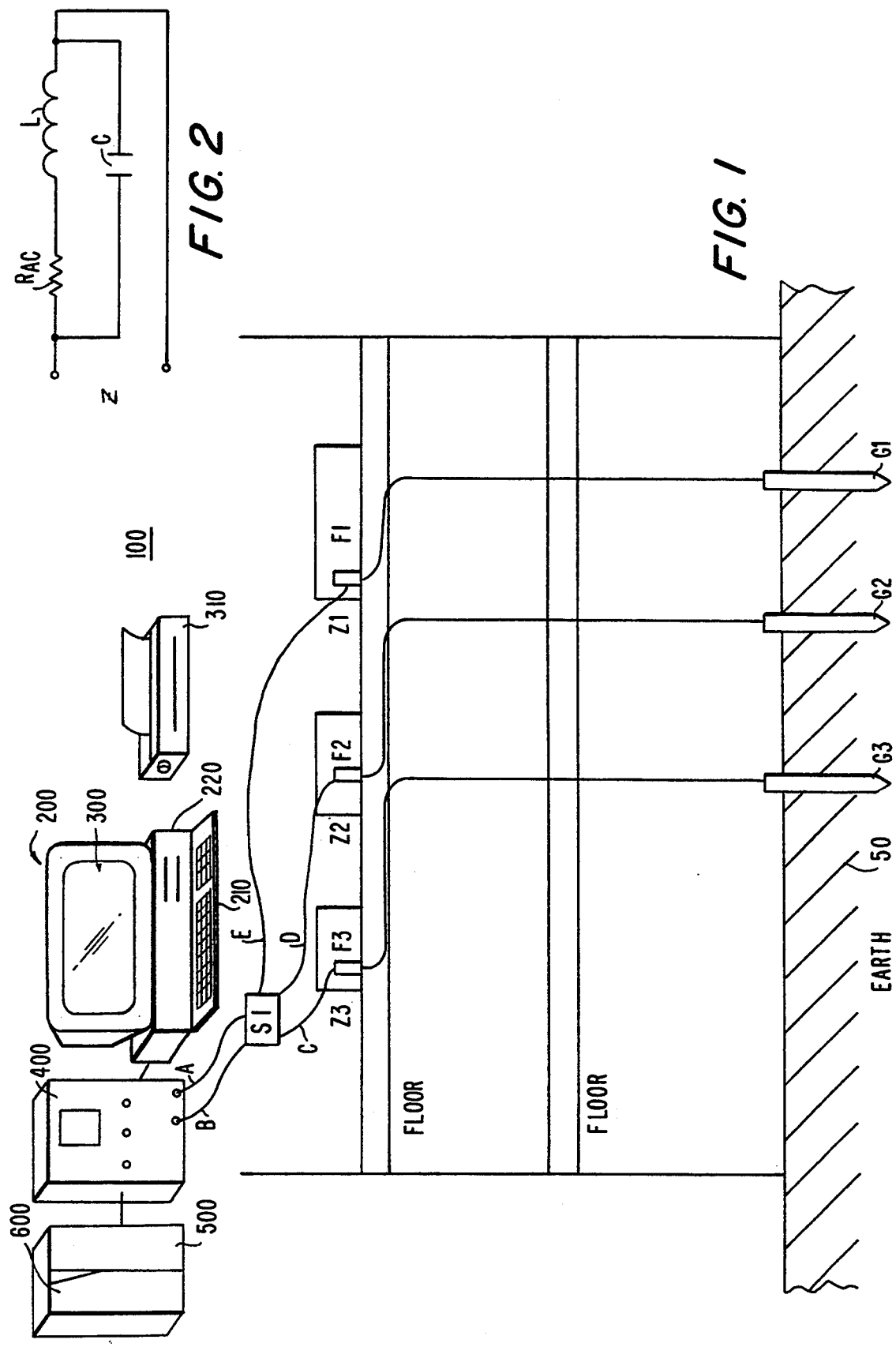

APPARATUS AND METHOD FOR MEASURING GROUND IMPEDANCE

This application is accompanied by a microfiche appendix of one sheet.

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

This invention relates to measuring the impedance of a ground path, more specifically, the real and imaginary components of the impedance at frequencies above dc.

BACKGROUND OF THE INVENTION

It is known how to measure the dc resistance of ground, at a grounding rod, since the dc resistance of the earth may change from one season to another, or be affected by moisture or other factors. A grounding rod may extend 20 feet into the earth and have a stub that extends upward above the earth's surface. It is also known how to measure the dc resistance of a grounding current path from a point that is remote from the grounding rod, such as on the third floor of a facility containing electrical or electronic equipment. Both of the foregoing measurements seek to measure the dc resistance of the ground current path. The current path to the grounding rod may extend through a metal strap, steel column, pipe, wire cable or other electrical conductor. At points several stories above the earth the steel columns or pipes may include several sections that have been joined by welds, in the case of columns, or couplers, in the case of pipes.

One known technique, known as the three point measurement method, for measuring dc ground resistance in the earth, at a particular grounding rod, measures the dc resistance of a ground path using a high impedance ohmmeter and two auxiliary grounding rods having about the same dimensions as the grounding rod being measured. The three grounding rods are embedded in the earth, spaced a distance apart of 6 meters or more to avoid overlapping grounding zones. The resistance between each pair of grounding rods is measured with the ohmmeter. The resistance of the desired ground path is then calculated based on the three impedance measurements and a set of well-known equations. Typically, each impedance measurement is made twice, once with the ohmmeter leads reversed, and averaged to avoid electrochemical voltaic effects or other potential measurement inaccuracies.

A second known technique for measuring dc ground resistance is referred to as the voltage-drop or fall of potential method. In this method, two auxiliary grounding rods, a current source, and a voltmeter are used. The first auxiliary grounding rod is spaced a selected distance from the grounding rod to be tested that is large compared to the size of the grounding rod. The second auxiliary grounding rod is located between the first auxiliary ground rod and the grounding rod to be tested. A direct current i is injected into the earth through the first auxiliary grounding rod and a voltage v is then measured between the second auxiliary grounding rod and the grounding rod to be tested. The resistance of the ground path to be tested is then obtained from the equation $R = v/i$.

One known commercial device for measuring dc ground resistance is available from James G. Biddle Co. under the trade name MEGGER. It uses an ohmmeter, a calibrated voltage source, and one auxiliary grounding rod in addition to the ground path being measured. The resistance is read directly from the ohmmeter.

One problem with these known methods is that they measure only the dc resistance and do not measure or determine ground path impedance, having both resistive and reactive components, at frequencies above dc.

It is known that a ground path to earth for grounding a structure or device has both an ac impedance and a dc resistance. See, e.g. Mardiguian, *Grounding and Bonding*, Chapter 2 pps. 2.1 et seq., published by Interference Control Technologies, Inc., which states, among other things, that the influence of the reactive component will increase at increasing frequencies and that there may be some frequencies where the ground path circuit becomes resonant.

Mardiguian, *Grounding and Bonding*, pps. 10.27 to 10.29, and Plumey et al., "High Frequency Harmonic Input Impedance Of An Antenna Embedded In A Conducting Half-Space", *Electromagnetic Compatibility*, 1983 *Proceedings*, pp. 45–50, discuss grounding lightning transients and refer to measuring ground impedance at frequencies above dc. The measurement is made using a grounding rod under test, an auxiliary grounding rod providing a current return, a reference grounding rod, a surge generator for injecting a current impulse through a matched resistor between the grounding rod under test and the first auxiliary grounding rod, and an oscilloscope or spectrum analyzer for measuring the voltage transients across a voltage divider network connecting the ground rod to be tested and the second auxiliary grounding rod. The impedance is determined from the ratio $v/i$ of the probe to earth voltage to the injected current transient.

It is known that the impedance of a grounding system is controlled by at least five major factors, skin effect, resonance, antenna effect, bonding, and earth impedance. Skin effect is the tendency of the current to flow in the outer conductive portion of a conductor at higher frequencies. This phenomenon causes the real and imaginary components of the impedance of a ground conductor to increase as the frequency increases. Skin effect in good conductors begins to rise rapidly with frequencies above 100 KHz. Resonances are caused by distributed capacitance in the conductor, proximate metal structures, and distributed inductance caused by bonded joints along the conductor path, self-inductance of grounding wires, as well as deposits in the earth. Antenna effects are related to resonances, and concern the efficiency of the ground path to act as an antenna and radiate or couple to external electromagnetic fields in the atmosphere. Bonding is the quality of bonds between portions of the ground path. For example, a bond having a low dc resistance may have a high impedance at high frequencies, which may result in stray inductive or capacitance reactance and adverse standing wave effects on the ground path. Earth impedance concerns the impedance of the earth in the vicinity of the grounding rod, which can vary with the geographical and environmental conditions, such as soil resistivity, water content and mineral deposits.

One problem with the known methods and devices for measuring ground path resistance is that they are not useful for measuring the ground path impedance at frequencies above dc. Indeed, there are no known commercial devices suitable for conducting such measurements in a practical manner. Further, no standards for conducting such ground impedance measurements at frequencies above dc are known to exist.

OBJECTS AND SUMMARY OF THE INVENTION

It is, therefore, an object of this invention to measure a ground path impedance other than the dc resistance.

It is another object of this invention to measure the impedance vector, including real and imaginary components, of the ground path at frequencies above dc. It is another object to provide a system for measuring ac ground path impedance from 5 Hz to 200 MHz. It is another object to evaluate that ac impedance information to assess the quality of the ground path and optionally to display the information in a usable format.

It is another object of this invention to provide for testing the quality of a ground path at frequencies above dc and, if multiple ground paths are available, selecting the best ground path.

It is another object of this invention to adapt the three-point measurement method and the fall of potential method to measure the ground path impedance at frequencies above dc.

In accordance with the foregoing objects, the present invention provides apparatus, systems and methods for measuring ground path impedance at frequencies above dc, and further, for evaluating the quality and nature of a measured ground path.

One aspect of the invention is directed to a method of measuring the impedance of ground paths at frequencies above dc using a first, second, and third ground paths to earth. One such method comprises the steps of:
(a) selecting a first plurality of frequencies within a defined frequency range;
(b) applying a first signal across a first ground path to earth and a second ground path to earth at each of the first plurality of frequencies, one discrete frequency at a time; and
(c) determining the impedance vector between the first and second ground paths in response to the first signal applied at each of the first plurality of frequencies.

In a preferred embodiment, the foregoing steps include, after step (c):
(d) applying the first signal across a third ground path to earth and one of the first and second ground paths to earth at each of the first plurality of frequencies, one discrete frequency at a time;
(e) determining the impedance vector between the third and the one of the first and second ground paths in response to the first signal at each of the first plurality of frequencies;
(f) applying the first signal across the third ground path and the other of the first and second ground paths at each of the plurality of frequencies, one discrete frequency at a time;
(g) determining the impedance vector between the third and the other of the first and second ground paths in response to the first signal at each of the plurality of frequencies; and
(h) determining the ground to earth impedance vector of one of the first, second, and third ground paths at each of the first plurality of frequencies from the determined impedance vector between each two of the first, second and third ground paths at each of the first plurality of frequencies.

Preferably, the applying step (b) includes providing a pair of test leads for conducting the first signal to two of the ground paths, and prior to the applying step (b), calibrating the test leads at each of the first plurality of frequencies so that the impedance vector of the test leads does not contribute to the determined impedance vector at each of the first plurality of frequencies.

The determined impedance vectors may be displayed for each of a second plurality of frequencies selected from the impedance vectors determined at each of the first plurality of vectors.

The method of the present invention also provides for determining the ground to earth impedance vector of each of the other of the first, second, and third ground paths at each of the first plurality of frequencies, and identifying which of the first, second, and third ground paths have lowest ground to earth impedance vectors.

The method also provides for evaluating the impedance vector array of a ground path to earth and identifying any resonance in the determined impedance vectors of the one ground path to earth. This information may be used to modify the ground path to minimize or control any resonant conditions.

Another method of measuring the impedance vector of a first ground path to earth at frequencies above dc, includes the steps of:
providing a second and a third ground path to earth, the second ground path being terminated between the first and third ground paths;
selecting a first plurality of frequencies within a defined range of frequencies;
applying a first signal to the third grounding path at each of the first plurality of frequencies, one frequency at a time;
monitoring a second signal across the first and second ground paths in response to each applied first signal; and
determining the impedance vector of the first ground path to earth at each of the first plurality of frequencies in response to the applied first signal and the monitored second signal at each frequency.

Another aspect of the present invention is directed toward a system for measuring impedance of ground paths at frequencies above dc. One such system includes:
a first, second, and third ground path to earth;
a first circuit for providing a signal at an output and determining the impedance across the output in response to the signal, the signal having a frequency selected from among a defined range of frequencies;
test leads for connecting the first circuit to two of the first, second, and third ground paths, respectively; and
a second circuit for controlling the first circuit to provide an output signal at each of a first plurality of frequencies in the defined frequency range, one frequency at a time, and for measuring the impedance vector at the first circuit output in response to each provided output signal.

Preferably the first circuit is a network analyzer having a uniform signal at the output at each selected frequency.

In a preferred embodiment the second circuit is a microprocessor-based device such as a microcomputer and includes a circuit for controlling the first circuit for calibrating the impedance vector of the test leads at each of the first plurality of frequencies, so that the test leads impedance vector does not contribute to the impedance vector of the ground paths determined by the first circuit.

The microprocessor-based device preferably includes processing means for calculating the ground to earth impedance vector of one of the first, second, and third ground paths at each of the first plurality of frequencies from determined impedances vectors between each two of the first, second, and third ground paths at each of the first plurality of frequencies.

A device for displaying the determined impedance vector at each of a second plurality of frequencies in the defined frequency range may be provided.

Another system for measuring the impedance vector of a first ground path to earth at frequencies above dc includes:

a second and third ground paths to earth;

a first circuit for providing a first signal across the first ground path and one of the second and third ground paths to earth, the signal having a frequency selected from among a defined range of frequencies;

a second circuit for monitoring a second signal across the first ground path to earth and the other of the second and third ground paths to earth in response to each first signal;

a third circuit for determining the impedance vector of the first ground path to earth in response to the first and second signals; and a fourth circuit for controlling the first circuit to provide the first signal at each of a plurality of frequencies in the defined frequency range, one at a time, so that the third circuit determines the impedance vector at each of the first plurality of frequencies.

BRIEF DESCRIPTION OF THE DRAWINGS

Further features of the invention, its nature and various advantages will be apparent from the accompanying drawings and the following detailed description of the invention in which like reference numerals refer to like elements, and in which:

FIG. 1 is a block diagram of the apparatus in accordance with a preferred embodiment of the present invention;

FIG. 2 is a model of a ground path;

DETAILED DESCRIPTION OF THE INVENTION

Figure 3A:
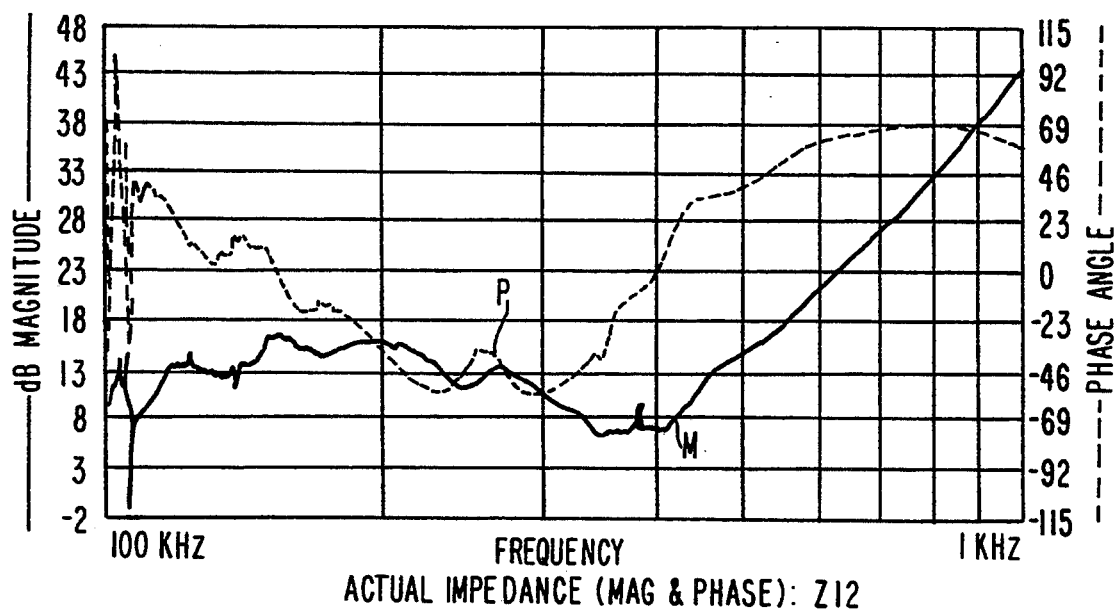
FIGS. 3A and 3B are graphical representations of the measured impedance between ground paths Z1 and Z2 of FIG. 1.

Referring to FIG. 1, an apparatus 100 for measuring impedance of a ground path in accordance with the present invention is illustrated. Apparatus 100 includes a minicomputer 200, including a microprocessor (not shown), a keyboard 210, at least one floppy disk drive 220, memory (not shown) and suitable software programming (described below in connection with FIG. 8 and the software appendix), and a display device 300, a network analyzer 400, an S-Parameter Test Set 500, and a Reflectance-Transmission Test Kit 600. Also, apparatus 100 includes two test leads A and B, and preferably three additional leads C–E and a switch S1 for connecting leads A and B selectively through leads C–E to test points or terminals F1–F3.

Display device 300, which may be part of minicomputer 200 or an additional peripheral device, may be a video monitor 300 or a printer 310 for presenting data in text, graphic, and tabular form.

Minicomputer 200 and its associated display devices may be any conventional microprocessor based device. A preferred mini-computer 200 includes a Technical Computer Model No. HP217, a keyboard Model No. HP46020A, a video monitor Model No. HP35721A, a dual floppy disk drive Model HP9122D, and a printer Model No. Think Jet HP2225A, all commercially available from Hewlett-Packard Corporation, Palo Alto, Calif.

Network Analyzer 400 may be any device for determining the real and imaginary impedance components of a network applied to analyzer 400. One preferred analyzer is model No. HP3577A, available from Hewlett-Packard, which may be operated under microprocessor control using the Hewlett Packard Basic programming language and the IEEE-488 Interface Bus. S-Parameter Test Set 500 may be any device for measuring the reflection coefficient in a transmission line, and is preferably a model No. HP35677A, available from Hewlett-Packard. Reflectance-Transmittance Test Kit 600 may be any signal divider device for measurement of low frequencies below 100 KHz, and is preferably a model No. HP35676A, available from Hewlett-Packard. These devices are used in determining the signal reflection coefficient from which the impedance may be derived in a conventional manner.

Test Leads A–E are formed of any suitable conductor for transmitting frequencies in the range of interest, e.g., up to about 200 MHz, preferably a 50 ohm coaxial cable, with an ungrounded shield, such as Belden Wire & Cable Model No. 9310 (military designation RG 58/U).

In the apparatus in FIG. 1, network analyzer 400 is used together with either S-Parameter Test Set 500 (frequency >100 KHz) or Reflectance-Transmittance Test Set 600 (frequency <100 KHz), so that leads A and B are connected to Port 1 of network analyzer 400 when S-Parameter Set 500 is used and to the 50 ohm output of network analyzer 400 when Reflectance-Transmittance device 600 is used. Such connections are known to persons of ordinary skill in the art.

Before discussing the apparatus in FIG. 1 in greater detail, it may be helpful to consider some of the background factors that attend ground impedance testing. Before a building requiring several electrical grounds is built, after excavation is completed, a copper grid may be installed on the surface of the earth, or a foot or two below the surface, where the building is to stand. The grid is typically formed by two sets of copper conductors, which cross one another orthogonally, with the conductors being joined together at the crossing points. Grounding rods, some 20 feet in length, may be driven into the earth, at some of the crossing points of the grid, and connected to the grid at the crossing points, with studs projecting upwardly for connection to steel columns or other above-earth ground conductors. Alternatively, such grounding rods, with connected studs, may be installed without an interconnecting grid.

With such an installation in place, ground impedance measurements may be of three types. The first concerns a measurement of the impedance of the earth itself, namely the impedance between a grounding rod and the earth that surrounds it. The second concerns a measurement of the ground impedance from a point remote from the grounding rod to earth, which typically includes the impedance of the conductors from the remote point to the grounding rod plus the impedance from the grounding rod to the surrounding earth. The third concerns a measurement of the impedance of the ground circuit from a point remote from the grounding rod to the grounding rod. Thus, a ground measurement may involve (1) the impedance of the grounding rod to earth, (2) the impedance of a ground path from a remote point to the grounding rod plus that of the grounding rod to earth, or (3) simply that of a ground path from a remote point to the grounding rod.

Using the three-point ground measurement method, which is preferred for the present invention, for the first type of ground impedance measurement, the measurement is made at three grounding rods that may be driven into the ground before a building is constructed or afterwards. At many government installations such measurements are repeated periodically, under different seasonal and precipitation conditions, to monitor the ground impedance, and to ensure that it has not varied significantly.

For the second type of measurement, the measurement is made at three points remotely located from the grounding rods, such as at a remote point on each of three steel columns or beams, or pipes or cables, that are used as electrical grounds, each such steel column or the like being connected to a different grounding rod.

For the third type of measurement, the measurement is again run at three points remote from the grounding rods, but in this case the steel columns or the like are all connected to the same grounding rod. This may be a situation to be avoided, since it is normally better to have the ground circuits connected to different grounding rods, but if it exists, the impedance of each grounding circuit, from the point of measurement to the common grounding rod, can be measured. Also, the impedance of the common grounding rod to earth can be determined by using test points that are connected to other grounding rods and running the second type measurement.

All of the foregoing types of measurements are called ground impedance measurements, and the paths to be measured in each case will be referred to as ground circuit paths or simply ground paths.

The ground impedance measurements of the present invention are made at numerous frequencies, such as at 400 different frequencies over a desired frequency range, such as between 5 Hz and 1 or 10 MHz or more. A plot of the impedance over the desired range can then be presented, and a table printed for all 400 frequencies, or for every tenth frequency. Also, where a resonance is found to occur one can measure the ground impedance at closer frequency intervals, to provide a detailed plot showing the precise nature and the peak point of the resonance.

The ground impedance measurements are based on measuring the reflection coefficient of the ground paths being tested at each frequency. The reflection coefficient is the ratio of the voltage reflected from a load divided by the voltage applied to the load at the input terminals. When the source impedance $Z_s$ is the conjugate of the load impedance $Z_L$, meaning that the resistive or "real" component of $Z_s$ and $Z_L$ are equal and their reactive or "imaginary" components are equal and opposite, all of the power will be absorbed by the load, and the reflection coefficient will be zero.

By knowing both the source impedance $Z_s$ and the input voltage, and measuring the reflected voltage, to obtain the reflection coefficient, $Z_L$ can be computed. These relationships are employed to determine the impedance of the ground circuit at each of the 400 frequencies in the selected frequency set.

In operation, the first step is to select a known source impedance. Also, it is preferable to select a source impedance that is purely resistive, such as 50 ohms. Next, the apparatus can be calibrated, for the interconnecting leads A-E, switch S1 and any associated connectors, and the resistive and reactive components of these elements in their various configurations, at each frequency to be measured, can be stored. Thus, the stored calibration data can be subtracted from actual measured data to yield the impedance characteristics of the ground path independent of the contribution of the apparatus.

With the source impedance thus known, a small current of about 20 ma can be injected into the ground circuit path at the test points, at a known voltage level, such as between about 0.5 and 1.0 volts, at each frequency to be measured, so that the input power is known. By measuring the reflected voltage, at each such frequency to be measured, the reflection coefficient can be determined, and the load impedance computed.

Using the three-point measurement method, and using the test points F1-F3 in FIG. 1, as will be discussed, the measurements are made between F1 and F2, between F1 and F3, and between F2 and F3. In this manner, the impedances Z12, Z13 and Z23 are derived at each of the selected frequency points, over the desired frequency range. These three impedances are then combined to produce Z1, Z2 and Z3, namely, the ground impedance of the three ground paths of interest.

The apparatus 100 in FIG. 1 is shown in the context of implementing the three-point measurement technique for measuring the ground path impedance vector from points F1-F3, spaced away from the ground rods G1, G2 and G3, over a frequency range above dc. The term impedance vector refers to the real and imaginary component of impedance at a given frequency.

As illustrated in FIG. 1, apparatus 100 is measuring the impedance of three ground paths, having impedances Z1, Z2, and Z3, which extend between points F1, F2, and F3, located, for example, on the third floor of a facility, through grounding rods G1, G2, and G3, to earth 50. The ground paths may be ones that extend to the grounding rods along metallic structural building members, pipes or conductive cables. Grounding rods G1, G2, and G3 are preferably spaced apart at least 18 feet (6 meters) from each other. Test leads A and B are connected between network analyzer 400 as noted above, and two of the points F1-F3, such as F1 and F2, such that impedance measurements can be made between test points F1 and F2, which measures the combined impedance of Z1 and Z2 (referred to as Z12), then F2 and F3, which measures Z2 and Z3 (referred to as Z23), and then F1 and F3, which measures Z1 and Z3 (referred to as Z13).

After calibrating the system for the leads A–E, connectors and switch S1, as already discussed, the network analyzer 400 injects a small known current, such as 20 ma at a known voltage, such as 0.6 volts, into one of the terminals Z1, or Z2, for each of the frequency points that is selected within the frequency range of interest. Further, it measures the reflected voltage, to obtain the reflection coefficient, and, as will be discussed, computes the impedance Z12. This is repeated using points F1 and F3 to obtain impedance Z13 at the same frequencies, and it also is repeated using points F2 and F3, to obtain Z23. Thus, the impedance vector between each of the three pairs of ground paths is obtained for the frequency range of interest.

As already noted, the frequency range selected by the operator includes frequencies between a minimum and maximum frequency (subject to the capacity of network analyzer 400). Preferably, a sample set of 400 discrete frequencies, relatively equally distributed within the selected frequency range, is used. Other frequency sample sets could be used. In the preferred embodiment, the frequency sample set is selected through the software controlling the measurements. The term impedance vector array refers to the array of impedance vectors for the respective discrete frequencies in the sample set used in the analysis.

In operation, a decision is made to use either S-Parameter Test Set 500 or Reflectance-Transmittance Test Set 600, which device is then conventionally connected to network analyzer 400. The frequency sample set to be used is then selected, and network analyzer 400 is then calibrated over the selected frequency sample set, using leads A–E, switch S1 and their associated connectors, connected to the appropriate terminal of network analyzer 400 (Port 1 or the 50 ohm output). The calibration procedure is performed at each discrete frequency in the provided sample set, and is conventional. The determined calibration impedance vector array is stored in memory so that it can be removed from measured impedance vector array of the ground paths. It is to be understood, however, that apparatus 100 need not be calibrated for each operation, if a prior calibration of the test leads in the same configuration has been made.

To perform the measurement, leads A and B are connected to the two ground paths to be measured, for example, from ground circuit test points F1 and F2, and network analyzer 400, as illustrated in FIG. 1. Network analyzer 400 is then operated under software control to select one frequency in the frequency sample set, to transmit a predetermined signal, such as a current of 20 ma at 0.6 volts, at that frequency, down the transmission line formed by leads A and B, and to calculate the impedance vector at its output as a function of the signal reflected back to network analyzer 400. Network analyzer 400 is then adjusted, by a program step to select another frequency in the sample set, generate the predetermined signal, and calculate the impedance vector based on the reflection coefficient for that frequency. This process continues over the selected frequency sample set, such that the test frequency range is swept, by the frequency being sequentially indexed in predetermined steps, through the plurality of discrete frequencies.

Following acquisition of the measured impedance vector Z12 array for the frequency sample set, leads A and B are then connected to another pair of ground circuit test points, e.g., F2 and F3, and the next set of impedance vectors Z23 for the same frequency sample set is similarly obtained. At the conclusion of those measurements, leads A and B are connected to the third pair of ground circuit test points, e.g., F1 and F3, and those impedance measurements are acquired. As the impedance vector measurements are obtained, they are provided to minicomputer 200 for further processing as described below.

The foregoing connection of leads A and B to F1 and F2, then to F2 and F3 and then to F1 and F3, is produced by switch S1, preferably operated by software commands. Of course, switch S1 could be omitted and leads A and B could be manually connected to two of test points F1, F2 and F3 at a time.

Once all of the impedance vector arrays are obtained for each pair of ground paths, they may be used to derive the ground path impedances for any or all of Z1, Z2, and Z3. This is accomplished by substituting the complex impedance term $Z = R + jX$ for the resistance term R in the known three-point measurement equations for dc resistance, as follows:

$$Z1 = R1 + jX1 = (Z12 + Z13 - Z23)/2$$

$$Z2 = R2 + jX2 = (Z12 + Z23 - Z13)/2$$

$$Z3 = R3 + jX3 = (Z13 + Z23 - Z12)/2$$

wherein the "Z" terms are the complex impedances, each including a real component "R" and an imaginary component "X". The real and imaginary components may be separated into the following equations:

$$R1 = (R12 + R13 - R23)/2$$

$$X1 = (X12 + X13 - X23)/2$$

$$R2 = (R12 + R23 - R13)/2$$

$$X2 = (X12 + X23 - X13)/2$$

$$R3 = (R13 + R23 - R12)/2$$

$$X3 = (X13 + X23 - X12)/2$$

Consequently, the real and imaginary impedance components for each ground path may be determined from the measured impedance between the pairs of ground paths.

Minicomputer 200, under software control, processes the acquired impedance vector data for the three impedance vector arrays between the three pairs of ground paths, to remove the impedance of the test leads when appropriate and, using the equations set forth above, to calculate the ground path to earth impedance vector array for any one of the ground paths.

In accordance with a preferred embodiment of the invention, these equations are solved using the acquired impedance measurements taken over a large frequency sample set. For example, 244 or 400 discrete frequency increments may be selected at equal intervals between 100 KHz and 1.0 MHz. The frequency range and the frequency resolution of a sample set may be decreased or increased as deemed appropriate under the circumstances.

The solutions to the impedance equations may be printed out by minicomputer 200 in text, graphic, and tabular form, and may be stored on floppy disk for further evaluation. When printing tabular data, if a large frequency sample set is employed, it is more convenient to select a subset of the accumulated database, for example, every tenth point, so that for a four hundred sample set, only forty points of data will be printed. Thus, the graphical and tabular data are believed to be sufficient to ascertain the nature of the ground path to earth impedance of the structure being evaluated. It is of course possible to increase the both frequency resolution of the sample set acquired and displayed and the frequency range within the needs under the circumstances and within the capability of the computer. However, the four hundred sample set is believed to be an adequate compromise between complexity and thoroughness, and the need to make a useful and practical device.

Where, for example, a resonance is found to occur at a test sample frequency, it may be desirable to increase sampling rates in the area of the resonance so that the peak resonant frequency can be precisely determined, and the nature of the resonance considered in detail.

Figure 3B:
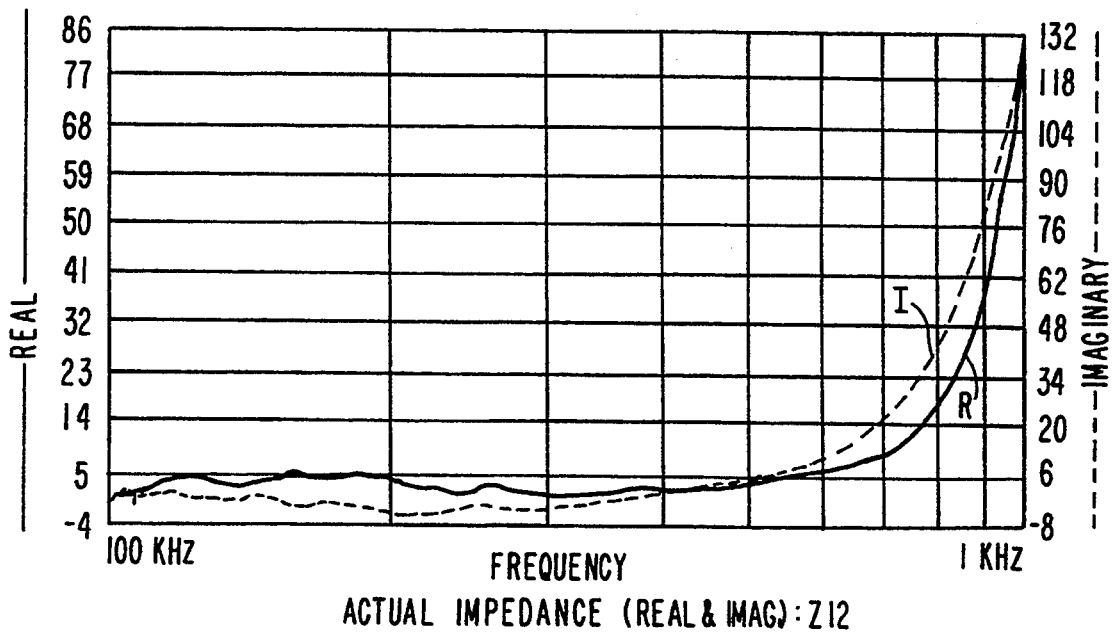

Referring to FIGS. 1, 3A, 3B, and 3C, the calibrated impedance vectors measured between test points F1 and F2 of ground paths Z1 and Z2 in a sample installation are illustrated. Once leads A and B are respectively connected to ground paths Z1 and Z2, the software routine described below is initiated to perform the measurements of the impedance between the two ground paths over four hundred discrete frequencies from 100 KHz to 1 MHz, adjust the determination if necessary to correct for the impedance of the test leads, and record the data on the floppy disks and display the data in accordance with instructions provided by the operator. FIG. 3A illustrates the impedance vector array as magnitude in dB along the left ordinate and the phase angle in degrees along the right ordinate of the measured actual impedance vector versus frequency along the abscissa, curve M being a plot of the impedance magnitude (dB), while curve P is a plot of the phase angle. A highly resonant condition is shown at 100 KHz and is believed to have been caused by a large metal capacitance. FIG. 3B illustrates the impedance vector array as real (left ordinate) and imaginary (right ordinate) components, in curves R and I, respectively, in ohms of the actual impedance versus frequency (abscissa).

Figure 4A:
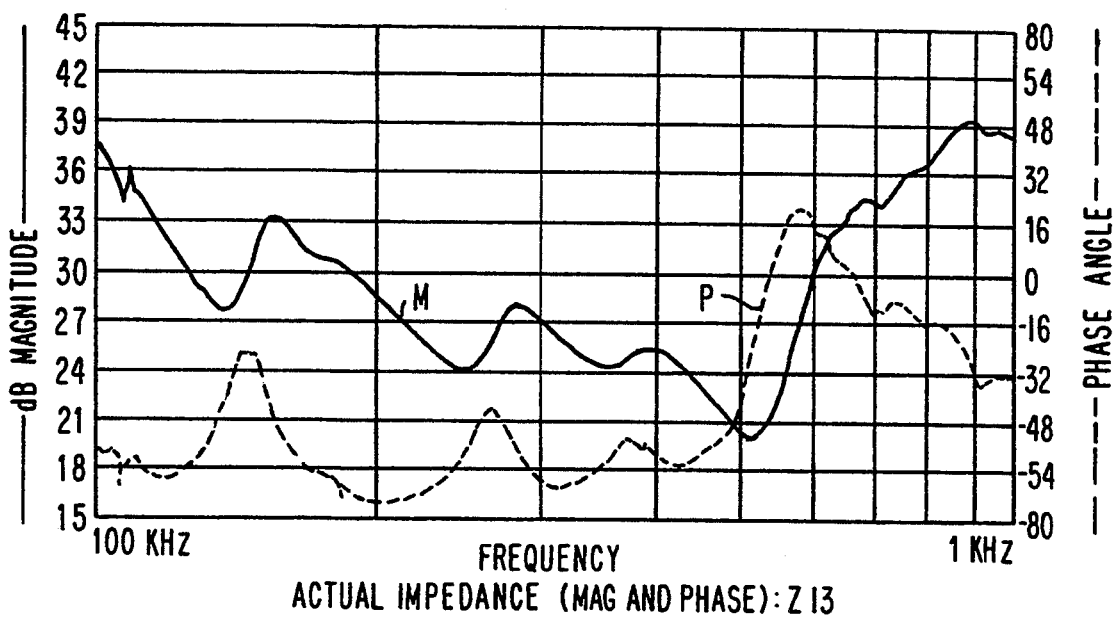
FIGS. 4A and 4B are graphical representations of the measured impedance between ground paths Z1 and Z3 of FIG. 1.
Figure 4B:
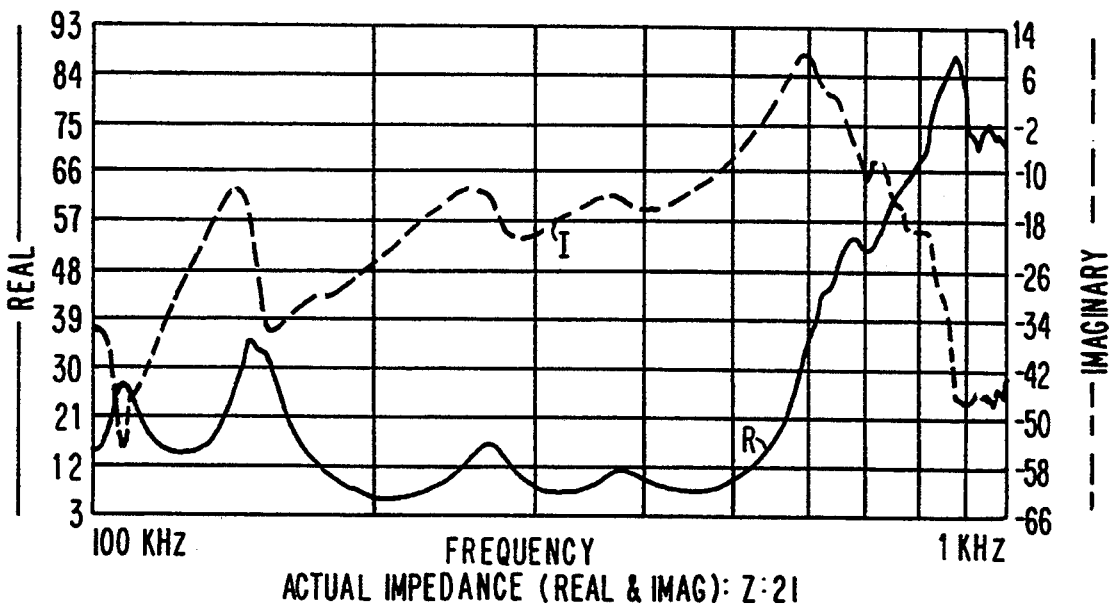

FIGS. 4A and 4B illustrate similar data taken for the impedance vector array measured with leads A and B respectively connected to test points F1 and F3 of ground paths Z1 and Z3, namely, graphical plots of the magnitude curve M (dB) and phase angle curve P (FIG. 4A) and real and complex (FIG. 4B) impedance curves R and I, respectively, verses frequency. These data also indicate a resonance at 100 KHz.

Figure 5A:
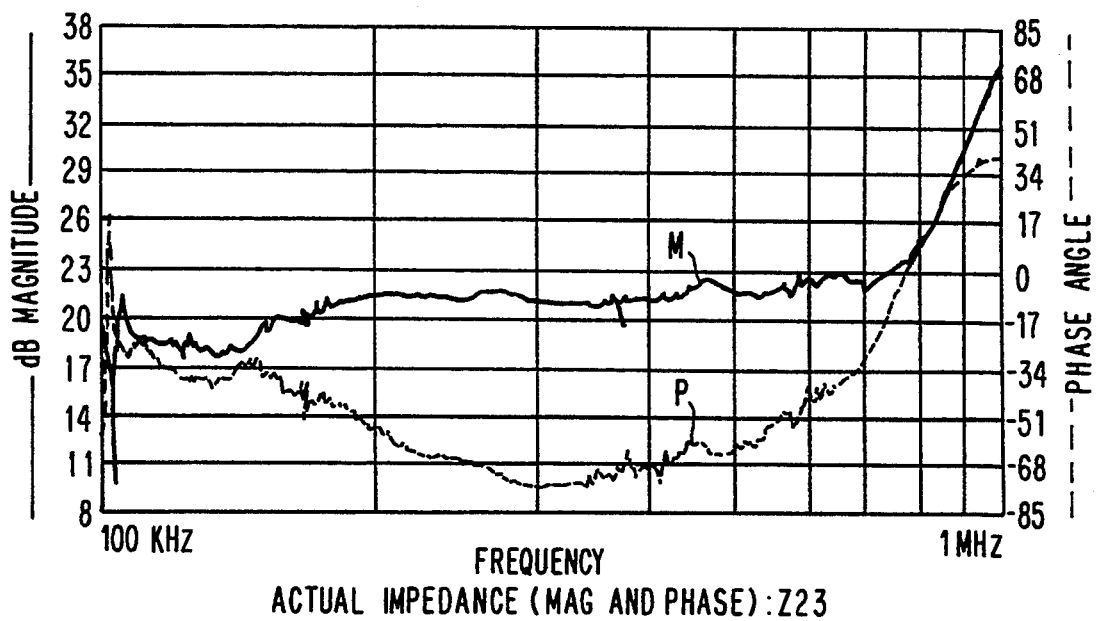
FIGS. 5A and 5B are graphical representations of the measured impedance between ground paths Z2 and Z3 of FIG. 1.
Figure 5B:
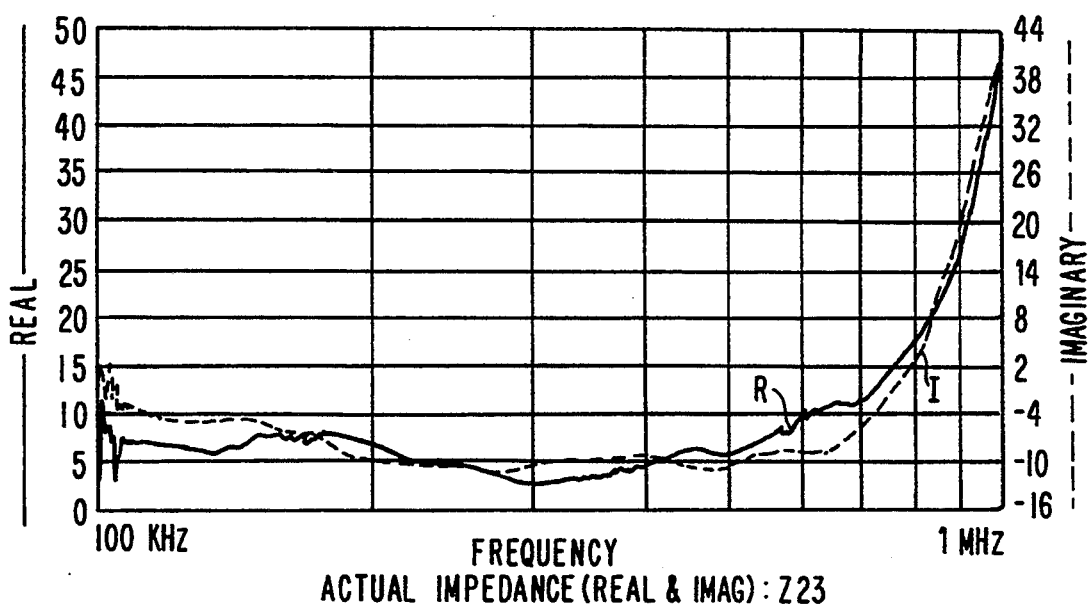

FIGS. 5A and 5B illustrate similar data taken for the impedance vector array measured with leads A and B, connected to test points F2 and F3 of ground paths Z2 and Z3, respectively. This includes graphical plots of the magnitude curve M (dB) and phase angle curve P (FIG. 5A) and real and complex (FIG. 5B) impedance curves R and I, respectively, verses frequency. These data also indicate a resonance at 100 KHz.

Figure 6:
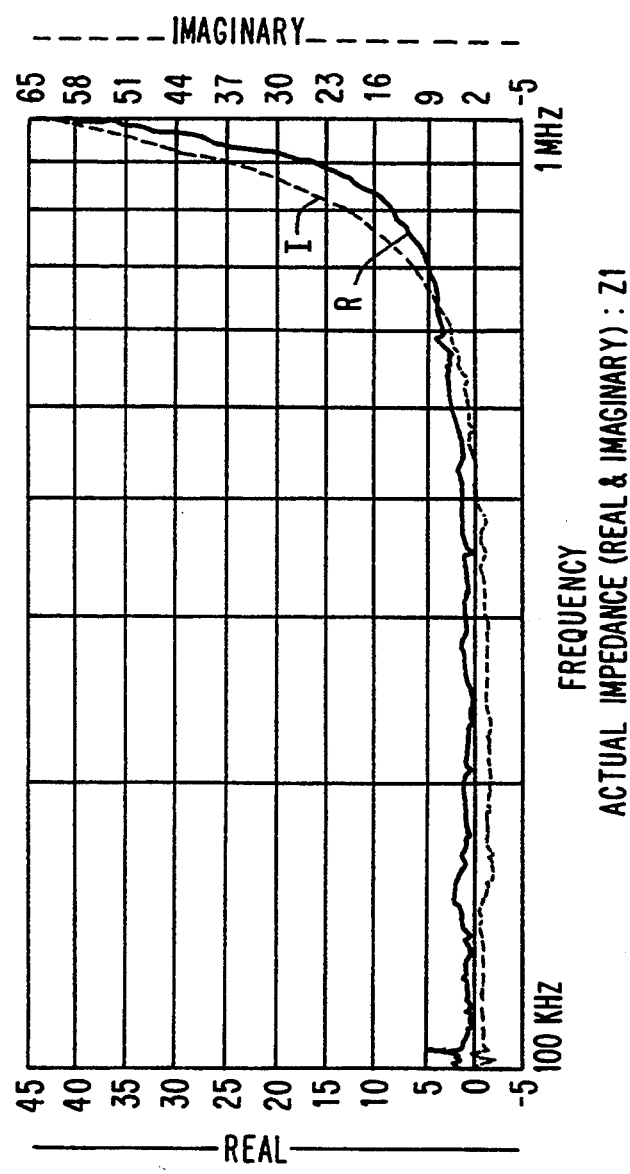
FIG. 6 is a graphical representation of the calculated impedance of ground path Z1 to earth.

FIG. 6 shows the impedance, real and imaginary, curves R and I respectively, for the path Z1, which has been calculated from the measured impedances Z12, Z13 and Z23. The Z1 curves can also be plotted for the magnitude and phase angle of Z1. The magnitude and phase angle plot is simply an alternative way of portraying the impedance of Z1 (alternative to the plot of the real and imaginary components.) Similarly, the same values are calculated for Z2 and Z3, and they can be plotted both as real and imaginary components and as magnitude and phase angle.

Antenna effects, wherein the ground path can radiate or couple to an external electromagnetic field, are related to the ground path resonances. The antenna effects are a function of the ground path length relative to a wavelength lambda, wherein Lambda=300/frequency (in MHz)

Figure 7A:
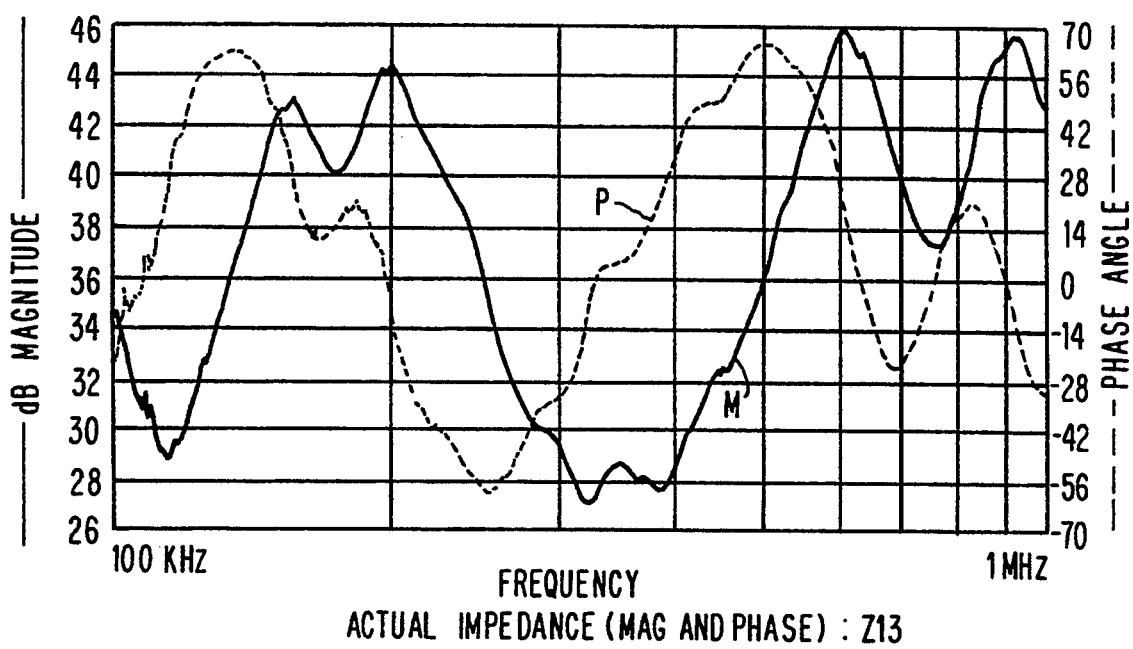
FIGS. 7A and 7B are graphical representations of determined impedances between two ground paths.
Figure 7B:
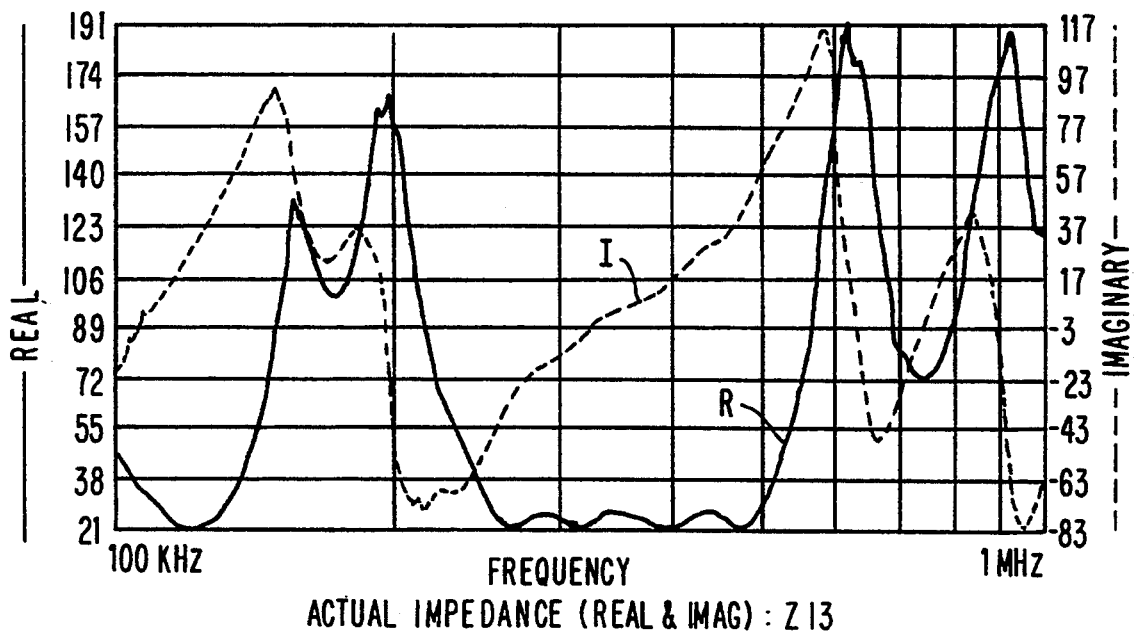

Referring to FIGS. 7A and 7B, ground path Z13 having resonances at 200 KHz ($\frac{1}{4}$ lambda), 600 KHz ($\frac{3}{4}$ lambda) and 900 KHz (5/4 lambda) are shown. A ground path of this characteristic will radiate and couple to external radiation. It can be corrected by altering the structure and quality of the ground path. For example, the resonance and related antenna effects can be reduced by moving the ground path, where it is a cable, away from structures such as electronic cabinet walls and other metallic surfaces, or moving a metallic surface away from the ground path, where the latter is a pipe or the like.

In accordance with one embodiment of the invention, the software prompts the operator to open circuit and short circuit leads A and B and apply a matched load across leads A and B for performing the calibration measurements and to connect leads A and B to the two desired ground paths for the ground impedance measurement, and to disconnect and reconnect leads A and B to a different pair of ground paths for the next two ground impedance measurements. However, it should be understood that in an alternate embodiment, apparatus 100 could include a calibration box having a software controlled switch, in addition to switch S1 in FIG. 1, for open circuiting, short circuiting, and applying a load across leads C, D and E automatically, which switch S1 is switched, after each such calibration, to successive pairs of the terminals F12, F13 and F23, by the microprocessor, to automate the lead calibration.

Referring to FIG. 6, the calculated impedance vector array of a representative ground path Z1 to earth is shown at frequencies between 100 KHz and 1.0 MHz, in graphical form. The impedance, both real and imaginary, rises significantly at frequencies approaching 1.0 MHz indicating that most ground leads have significant capacitive reactance which increases at higher frequencies and the real term increases due to skin effect. Thus, the ground path may be modified, e.g., using braided and higher gauge wire, reducing the number of weld joints, and spacing the ground leads away from metal structures, to minimize the reactance and resistance to a controllable level. Importantly, the invention allows for improving or optimizing the ground path quality before construction of the structure is completed, e.g., before the bricks are laid, the concrete floors or walls are poured, and before interior walls are finished.

Figure 8A:
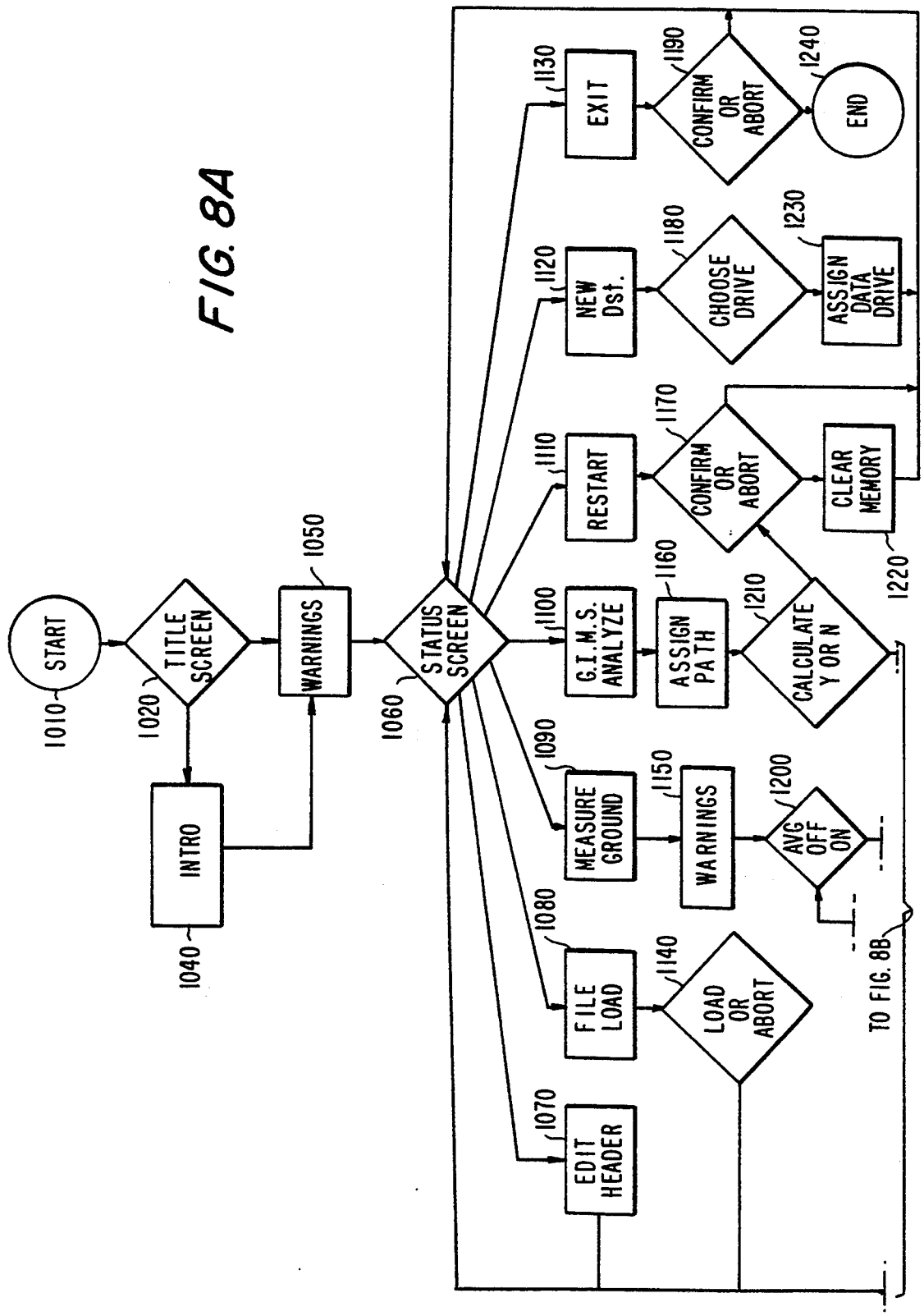
FIGS. 8A and 8B contain a flow chart for the operation of the device of FIG. 1.
Figure 8B:
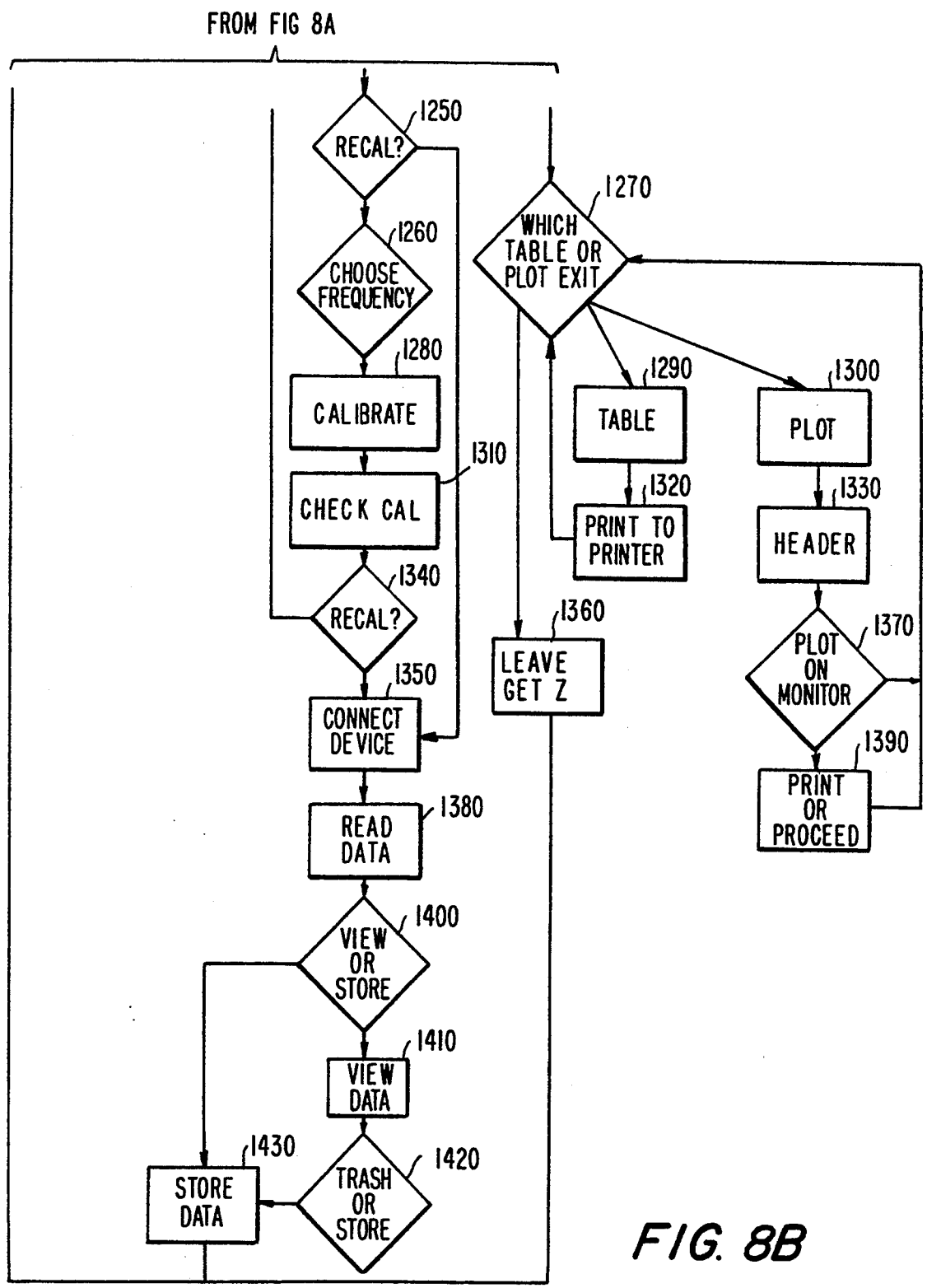

Referring to FIG. 8, a flow chart of a preferred method of operation of the present invention is illustrated. The software appendix to this specification is cross referenced to the flow chart and the following discussion by parenthetical references to the software program code line numbers ("PCL            "). The software is written in the Hewlett-Packard Basic language, which is commercially available. At Start 1010 the software is called and performs several initialization routines for setting (i) default parameters for data acquisition and processing, (ii) data flags and pointers, (iii) display parameters, and (iv) the function keys of the keyboard to access various subroutines (PCL 415). The program next activates the visual display device 300 to present a title screen at 1020, introductory text at 1040 (PCL 23335) to guide the operator in using the system (unless the operator elects to skip the introductory portion), and warnings at 1050. Thereafter, the program proceeds to Status Screen 1060 (PCL 1620) and the software enters a Level 1 routine (PCL 2315) where it is in a loop until the operator presses a function key to initiate a processing routine. Status Screen 1060 also displays the status of the system with respect to various processing routines and parameters.

The Level 1 routine and Status Screen 1060, are the branching point for entering the following processing routines: Header 1070 (PCL 1880), File Load 1080 (PCL 4330), Measure Ground 1090 (PCL 5160), GIMS Analysis 1100 (PCL 27090), Restart 1110 (PCL 1145), New Dst. 1120 (PCL 895), and Exit 1130 (PCL 695). As noted, these processing routines are typically accessed by the operator hitting the preset function keys which respectively call the routines when the interactive keyboard is active (there may be times when the keyboard is inactive) (PCL 415). At the conclusion of any routine, the system will typically return to Level 1 processing and Status Screen 1060 (except for the Exit routine at 11130), unless the routine was called during execution of another processing routine, in which case the return will be to that other processing routine (not Level 1 processing).

The routine Edit Header 1070 (PCL 1880) provides the identifying information for test data acquired by the system. The routine prompts the operator to input information identifying the test setup and the measurements to be obtained which are stored in either in memory or on a disk, along with any corresponding acquired measurement data. Header information includes, for example, Title, Subtitle, Impedance path, Method of Test, System tested, Operator's name, Instruments Used, Note #1, and Note #2, and date and time of the measurement. The Header routine also is used to modify headers previously created and stored in memory or on a disk. Following creation of a new header or editing of a prior header the system waits for further input and returns to Level 1 processing and Status Screen 1060, except as discussed below in connection with the routine GIMS Analysis 1100.

The routine File Load 1080 (PCL 4330) retrieves data previously stored on a disk, inspects the data to determine at 1140 (PCL 4315) whether the data is compatible with the operating system or incompatible. If the data is compatible, the File Load routine loads the data into memory and returns to Level 1 processing. If the format is not compatible, the routine attempts to convert the data to a proper format and then loads the data in memory if it can or indicates that the data on the disk is not compatible, and returns to Level 1 processing.

The routine Measure Ground 1090 (PGL 5160) acquires the ground path impedance vector array measurements. Once the routine is initiated by the operator, it proceeds to warnings at 1150 (PCL 6315), which warns that proceeding to acquire new data will wipe all files in memory. At that point, the operator may elect to abort or continue the acquisition routine (PCL 6450). If the routine continues, the operator is prompted at 1200 (PCL 6645) to Set Exponential Averaging on or off. Exponential averaging is used to provide a weighing factor with exponential averaging on the network analyzer, which takes advantage of eight sweeps to arrive at a weighing factor. After the setting the averaging on or off, the routine enters a calibration sequence at 1250 where the operator is prompted to continue with the existing calibration or to recalibrate the test leads with the network analyzer to be used in the impedance measurement.

If the operator indicates that the system has already been properly calibrated, the routine passes to Connect Device at 1350. If instead the operator indicates that the system is to be calibrated, then the routine passes to the calibration sequence (PCL 7620) where the operator is sequentially prompted (1) to turn the network analyzer on and wait until it is warmed up, (2) to connect the test leads to the appropriate terminal of the network analyzer depending on whether the S-Parameter test set 500 or the Reflectance-Transmittance Set 600 is used, (3) to terminate the lead, which is preferably a 50 ohm coaxial cable, and (4) to use a shielded connector for the test in the calibration sequence.

The calibration routine also inquires whether to abort calibration and abort taking new data or to proceed (PCL 7785). Aborting will reset the system to an uncalibrated status and return the program to Level 1 processing and Status Screen 1060. Proceeding will pass the routine to Choose Frequency at 1250 (PCL 7985) where the operator selects the frequency range and sample set from a menu. The frequency range menu includes, for example, a full frequency range of 5 Hz to 200 MHz, an AM frequency range of 0.5 MHz to 2.0 MHz, an FM frequency range of 80 MHz to 110 MHz, a low frequency range of 100 Hz to 100 KHz, a high frequency range of 100 KHz to 200 MHz, and a frequency range to be defined and entered by the operator (PCL 8010). The frequency sample set within the range in this embodiment is pre-selected to be 400 discrete frequencies. In an alternate embodiment the number of discrete frequencies and the frequency distribution in a sample set may be selected by this operator.

After selecting the frequency sample set, the routine passes to the sequence Calibrate at 1280 (PCL 8420) where the operator is instructed to connect the leads to be calibrated, whereupon network analyzer 400 is controlled to conduct the calibration procedure by automatically stepping through the defined frequency range and sample set once with the leads open, once with the leads shorted, and once with a 50 ohm load across the leads. Following completion of the Calibrate sequence, the routine passes to a Check Calibration routine at 1310 (PCL 9490). If recalibration is necessary, the routine returns to Set Exponential Averaging at 1200 and repeats the calibration procedure. If, however, the calibration is acceptable, then the routine passes, in sequence, to Connect Device at 1350 (PCL 5250), where the operator is instructed to connect the test leads to the pair of ground paths (PCL 5340), and to the routine Read Data at 1380 (PCL 7185, 5250). The network analyzer is then operated to measure and record the impedance vector array over the frequency sample set, i.e., 400 discrete frequencies (PCL 5255) spanning the defined frequency range (PCL 5500).

Next, the routine passes to View or Store at 1400 (PCL 7215) where the operator is prompted to instruct whether the data taken is to be stored on a disk or to be analyzed and displayed. If the data is to be stored, the routine passes to Store Data at 1437 (PCL 7370, 5625) where the data is stored in a file named by the operator. If instead the data is to be viewed, then the routine passes to View Data at 1410 (PCL 7430) where the data taken is displayed as a graph of real and imaginary components versus frequency. The operator is then prompted at 1420 (PCL 7380) whether to store the displayed data on a disk or to discard the data. If the data is to be discarded (PCL 7380) it will not be saved after the display is complete. The display may be printed out at the operator's option. Alternatively, the data may be stored at 1430. Once the data is stored or discarded, the routine returns to Level 1 processing and Status Screen 1060 and waits further instruction from the operator.

The routine GIMS Analysis 1100 (PCL 27090) processes acquired raw data files and calculates the real and imaginary impedances for the ground paths measured, and also for one or more of the ground path to earth impedances. In order to calculate a ground to earth impedance vector array, the routine must first process the raw data for each of the three ground paths measured into three ground path impedance vector arrays. This occurs one ground path array at a time.

Following initialization of the GIMS Analysis routine (PCL 27100), the operator is prompted to enter which ground path impedances are to be calculated at 1160 (PCL 27250). When the operator identifies the first ground path, the raw data is called into memory and the impedance vector array is determined. The routine next prompts whether the impedances are to be calculated at (PCL 27560). If only one (or two) impedance vector arrays has been previously created, the operator must obtain the other two (or one) arrays before the ground to earth path impedance vector array may be calculated. The operator then enters no to the prompt and the routine passes to confirm or abort at 1170. The operator is then prompted to hit the restart key (PCL 28104). This permits the operator to obtain the raw data for determining the next impedance vector array.

If all three measured ground path arrays have been determined, the operator enters yes to the prompt, and the GIMS Analysis routine performs the instructed calculations. The operator is then prompted at decision point 1270 (PCL 27810) to instruct the routine to the display format to be used for the measured and calculated impedance vectors. At that decision point 1270, the operator can select a table, a plot or to exit the analysis routine. If the operator selects to exit (PCL 27951, 28102), then the routine passes to Leave GETZ at 1360 and requires the operator to hit the restart key to return to Level 1 processing, as described above.

If the operator selects a table, then the routine passes to the routine Table at 1290 (PCL 28380), where the calculated impedances are presented in tabular form (See, e.g., FIG. 3C) and printed by the routine Print to Printer at 1320 (PCL 28510). The results in the paper printer printing the impedance vector determined for every tenth frequency in a table of forty of the 400 discrete measurements. Following Printing at 1320, the routine returns to decision point 1270 where the operator is prompted to elect a choice.

If the operator elects a plot, the routine passes to the routine Plot 1300 (PCL 28760) where the calculated impedances are processed in preparation for plotting. The operator is prompted to enter the routine Header 1070, discussed above, at 1330 (PCL 29161) to provide a header for the data to be plotted. In this routine, however, after the header information is defined, the routine returns to routine GIMS Analysis (rather than to Level 1 processing) where the operator is then prompted at 1370 (PCL 20250) to select whether to display the plot on the monitor or to print the plot on paper at 1390. After the selection is made, the routine returns to decision point 1270.

The routine Restart 1120 (PCL 1145) is activated by the operator pressing the selected restart function key. After the restart key is pressed, the Restart routine inquires at 1170 whether to continue with or to abort the restart. If the instruction is to abort, then the routine will exit Restart and returns to Status Screen 1060 (PCL 1260) with the established files and settings left intact. If the instruction is to confirm restart, then the Restart routine passes to the routine Clear Memory 1220 (PCL 1310) where it leaves the calculated impedance vector data array(s) in memory, deletes the raw data files from memory, and resets the settings to default values. Then, the routine returns to Level 1 processing (PCL 2315) where it remains in a loop until a function key is entered by the operator. This provides for accumulating all of the impedance data arrays for the ground paths for use in calculating the ground path to earth impedance.

The routine New Dst. 1120 (PCL 895) selects for the data destination as between floppy drive 0 and floppy drive 1. When the routine is entered by the function key, the operator is prompted at 1180 (PCL 930) to decide which drive path is to be used. The selected drive path is assigned by the routine at 1230. After the assignment is made, the routine returns to the Level 1 routine at Status Screen 1060.

The routine Exit 1130 (PCL 695) is entered when the operator hits the appropriate function key. The Exit routine then prompts the operator at 1190 whether to abort (PCL 730) and return to Level 1 processing and Status Screen 1060 (PCL 855) or to confirm the exit (PCL 720), save data, and end the program at End 1240.

Referring to FIG. 2, the model for the ground impedance on which the present invention is based includes the network of resistor Rac in series with inductor L, which are in parallel with Capacitor C, wherein L is the inductance of the ground strap or wire, C is the capacitance of the structure being grounded to the surroundings, and Rac is the sum of the resistance of the earth and the resistance of the ground rod and strap. For dc conditions, Rac is the dc resistance. The measured resistance is the real part of the vector $R = Z \cos(\theta)$ at the test frequency. The ac resistance increases with frequency due to skin effect. The measured resistance is related to the wire ac resistance as follows:

$$R_{measured} = Re(Z)$$

$$Re(Z) = \frac{R_{AC}}{(1 - w^2LC)^2 + (wR_{AC}C)^2}$$

In the case of parallel resonance, $w^2LC = 1$ and:

$$R_{measured} = \frac{R_{AC}}{w^2R_{AC}^2C^2} = wL(wL/R_{AC}).$$

The term $wL/R_{AC}$ is defined as Q, the quality factor, so: $R_{measured} = wLQ$ at parallel resonance or resistive peaks. Series resonance is defined as:

$$Z_S = wL/Q = wL(R_{AC}/wL) = R_{AC}$$

so that $R_{measured}=R_{AC}$ only at the resistance minimums. With reference to FIG. 7A, these occur at frequencies of 170 KHz, 320 KHz and 750 KHz.

The only time the ac measured resistance equals the actual ac wire resistance is at the resistance minimums (FIG. 7A) where the wire reactance goes through zero.

The impedance of this model is given by:

$$Z = \frac{1}{\frac{1}{R_{ac}+jwC}+jwC} = \frac{R_{ac}+jwL}{1+jwc(R_{ac}+jwL)} = \frac{R_{ac}+jwL}{1-w^2LC+jwR_{ac}C}$$

One application of this invention that is useful is in determining whether large structures, such as buildings, and in particular power generating or transmitting facilities and communications facilities, are adequately grounded at high frequencies, and whether they radiate or couple to external electromagnetic radiation to a significant and deleterious extent. Another application is to perform an analysis of the determined impedance vector array data and select the best ground to earth path among, for example, the three ground to earth paths used in the measurement, or other available ground paths. Similarly, if none of the ground paths to earth is adequate the operator may be prompted to test other ground paths, in addition, an appropriate computer program may search for and identify any resonances in the calculated ground path to earth impedance vector array for a given ground path, so that problem points, e.g., resonance conditions, can be brought to the operator's attention. It should be understood that more than three ground paths can be used to determine the impedance of a ground path to earth.

In an alternate embodiment, the voltage drop technique for measuring ground to earth impedance may be used. In this embodiment, a frequency sample set is created of a plurality of frequencies within a defined range. The apparatus then selects a first frequency, injects a known test current I at that frequency at a first auxiliary ground path and measures the complex voltage drop V between the ground path being tested and a second auxiliary ground path, the second auxiliary ground path having a grounding rod interposed between the grounding rods of test ground path and the first auxiliary ground path at a specific location. These data are saved in memory. The remainder of the complex voltage drop measurements for the remaining frequencies in these sample sets are successively obtained. The complex voltage drops are then processed with the known test currents (and the calibration factor for the test leads, if any) to obtain the array of ground path to earth impedance vectors for each of the frequencies in the sample set. This acquired impedance vector array information may be processed to be subsequently displayed as described above.

One skilled in the art will appreciate that the present invention can be practiced by other than the described embodiments which are presented for purposes of illustration and not of limitation.

I claim:

1. A system for measuring impedance of ground paths at frequencies above dc comprising:
   a first, second, and third ground path to earth;
   a first circuit for providing a signal at its output and determining the impedance vector across the output in response to the signal, the signal having a frequency selected from among a selected range of frequencies;
   test leads for connecting the first circuit output to two of the first, second, and third ground paths; and
   a second circuit for controlling the first circuit to provide an output signal at each of a first plurality of frequencies in the selected frequency range, one frequency at a time, and to determine the impedance vector across the first circuit output in response to each provided output signal.

2. The system of claim 1 wherein the first circuit further comprises a network analyzer having a calibrated signal at the output at each selected frequency.

3. The system of claim 2 wherein the first circuit further comprises a circuit for determining a reflection coefficient in response to the signal on the test leads.

4. The system of claim 2 wherein the second circuit further comprises a microprocessor.

5. The system of claim 4 wherein the second circuit further comprises:
   processing means for calculating the ground to earth impedance vector of one of the first, second, and third ground paths at each of the first plurality of frequencies from determined impedances vectors between each two of the first, second, and third ground paths at each of the first plurality of frequencies.

6. The system of claim 5 further comprising a device for displaying the calculated ground path to earth impedance vectors at each of a second plurality of frequencies in the selected frequency range.

7. The system of claim 1 wherein the second circuit further comprises a third circuit, responsive to the second circuit, for controlling the first circuit for calibrating the impedance vector of the test leads at each of the first plurality of frequencies, so that the test leads impedance vector does not contribute to the impedance vector of the ground paths determined by the first circuit.

8. The system of claim 7 in which the system as interactive for use by an operator and further comprises:
   a device for displaying instructions to the operator for connecting the test leads for calibrating the test leads and for connecting the test leads to the first, second, and third ground paths two at a time, and for controlling the first circuit; and
   a keyboard for the operator to respond to the displayed instruction.

9. The system of claim 1 further comprising a device for displaying the determined impedance vector at each of a second plurality of frequencies in the selected frequency range.

10. A method of measuring impedances of ground paths at frequencies above dc using a first, second, and third ground paths to earth, comprising:
   (a) selecting a first plurality of frequencies within a defined frequency range;
   (b) applying a first signal across a first ground path to earth and a second ground path to earth at each of the first plurality of frequencies, one frequency at a time; and
   (c) determining the impedance vector across the first and second ground paths in response to the first signal at each of the first plurality of frequencies.

11. The method of claim 10 in which the applying step (b) further comprises:
providing a pair of test leads for conducting the first signal to two of the first, second and third ground paths, the method further comprising, prior to the applying step (b),
calibrating the test leads at each of the first plurality of frequencies so that the impedance vector of the test leads does not contribute to the determined impedance vector at each of the first plurality of frequencies.

12. The method of claim 11 further comprising providing an interactive computer terminal for instructing an operator when and how to connect the pair of test leads to two of the first, second, and third ground paths.

13. The method of claim 10 further comprising, after step (c):
(d) applying the first signal across a third ground path to earth and one of the first and second ground paths to earth at each of the first plurality of frequencies, one frequency at a time;
(e) determining the impedance vector across the third and the one of the first and second ground paths in response to the first signal at each of the first plurality of frequencies;
(f) applying the first signal across the third ground path and the other of the first and second ground paths at each of the plurality of frequencies, one frequency at a time;
(g) determining the impedance vector across the third and the other of the first and second ground paths in response to the first signal at each of the first plurality of frequencies; and
(h) determining the ground to earth impedance vector of one of the first, second, and third ground paths at each of the first plurality of frequencies from the determined impedance vector across each two of the first, second and third ground paths at each of the first plurality of frequencies.

14. The method of claim 13 in which the applying step (b) further comprises providing a pair of test leads for conducting the first signal to two of the first, second and third ground paths, the method further comprising, prior to the applying step (b), calibrating the test leads at each of the first plurality of frequencies so that the impedance vector of the test leads does not contribute to the determined impedance vector at each of the first plurality of frequencies.

15. The method of claim 10 further comprising:
displaying the determined impedance vectors for each of a second plurality of frequencies selected from the impedance vectors determined at each of the first plurality of frequencies.

16. The method of claim 13 further comprising:
selecting a second plurality of frequencies from among the first plurality of frequencies, the second plurality being smaller than the first plurality; and
displaying the determined impedance vectors for each of the second plurality of frequencies.

17. The method of claim 13 further comprising:
determining the ground to earth impedance vector of each of the other of the first, second, and third ground paths at each of the first plurality of frequencies;
comparing the determined ground to earth impedance vectors of the first, second and third ground paths; and
identifying which of the first, second, and third ground paths has the better ground to earth path.

18. The method of claim 13 further comprising identifying any resonance in the determined impedance vectors of the one ground path to earth.

19. A system for measuring the impedance vector of a first ground path to earth at frequencies above dc comprising:
a second and third ground paths to earth;
a first circuit for providing a first signal across the first ground path and one of the second and third ground paths to earth, the signal having a frequency selected from among a defined range of frequencies;
a second circuit for monitoring a second signal across the first ground path to earth and the other of the second and third ground paths to earth in response to each first signal;
a third circuit for determining the impedance vector of the first ground path to earth in response to the first and second signals; and
a fourth circuit for controlling the first circuit to provide the first signal at each of a plurality of frequencies in the defined frequency range, one at a time, so that the third circuit determines the impedance vector at each of the first plurality of frequencies.

20. The system of claim 19 wherein the first and second circuits further comprise a first test lead and a second test lead for applying the first signal and monitoring the second signal respectively, and a fifth circuit for calibrating the first and second test leads at each of the first plurality of frequencies so that the impedance vectors of the test leads do not contribute to the impedance vector determined by the third circuit.

21. The system of claim 20 in which the system is interactive for use by an operator and further comprises:
a device for displaying instructions to the operator for connecting the first and second test leads for calibrating the test leads and for connecting the first and second test leads to second and third ground paths and for controlling the first circuit; and
a keyboard for the operator to respond to the displayed instruction.

22. The system of claim 19 wherein the fourth circuit further comprises a microprocessor.

23. The system of claim 19 further comprising a device for displaying the determined impedance vector at each of a second plurality of frequencies in the defined frequency range.

24. A method of measuring the impedance vector of a first ground path to earth at frequencies above dc, comprising:
providing a second and a third ground path to earth, the second ground path being terminated between the first and third ground paths;
selecting a first plurality of frequencies within a defined range of frequencies;
applying a first signal to the third grounding path at each of the first plurality of frequencies, one frequency at a time;
monitoring a second signal across the first and second ground paths in response to each applied first signal; and
determining the impedance vector of the first ground path to earth at each of the first plurality of frequencies in response to the applied first signal and the monitored second signal at each frequency.

25. The method of claim 24 further comprising:
displaying the determined impedance vector for each of a second plurality of frequencies selected from the impedance vectors determined at each of the first plurality of frequencies.

26. The method of claim 24 further comprising:
selecting a second plurality of frequencies from among the first plurality of frequencies, the second plurality being smaller than the first plurality; and
displaying the determined impedance vectors for each of the second plurality of frequencies.

27. Apparatus for measuring a ground path at frequencies above dc comprising:
a first circuit for providing a signal at its output and measuring the reflected power in response to the signal, the signal having a frequency selected from among a selected range of frequencies;
test leads for connecting the first circuit output to a first ground path and a second ground path connected in series wherein the first circuit measures reflected power across said first and second ground paths, the first and second ground path forming a test ground path,
a second circuit for controlling the first circuit to provide an output signal at each of a first plurality of frequencies within the selected frequency range, one frequency at a time, and to measure the reflected power in response to each provided output signal.

28. The apparatus of claim 27 further comprising means for determining the impedance vector of the test ground path based on the measured reflected power at each of the plurality of frequencies.

29. The apparatus of claim 27 or 28 wherein the first circuit further comprises a network analyzer having a calibrated signal at the output at each selected frequency.

30. The apparatus of claim 28 wherein the test leads are calibrated at each of the first plurality of frequencies and the determining means removes the impedance contributions of the test leads when determining the impedance vector of the test ground path.

31. The apparatus of claim 30 further comprising a third circuit, responsive to the second circuit, for controlling the first circuit for calibrating the impedance of the test leads at each of the first plurality of frequencies.

32. The apparatus of claim 27 wherein the second circuit further comprises a microcomputer.

33. The apparatus of claim 28 wherein the second circuit and determining means further comprise a microcomputer including a processing means for calculating the ground to earth impedance vector of one of a first, second, and third test ground paths at each of the first plurality of frequencies based on the reflected power measured across each two of the first, second, and third ground paths connected in series, at each of the first plurality of frequencies.

34. The apparatus of claim 33 wherein the test leads are calibrated at each of the first plurality of frequencies and the impedance contribution of the test leads is removed when determining the impedance vector of a test ground path.

35. The apparatus of claim 28 further comprising a device for displaying at least a portion of the determined impedance vector at each of a second plurality of frequencies in the selected frequency range.

36. The apparatus of claim 30 or 34 further comprising an interactive keyboard and display for displaying instructions for connecting the test leads to the first circuit and one or more loads for calibrating the test leads at the first plurality of frequencies.

37. The apparatus of claims 27, 28, or 33 further comprising an interactive keyboard and display for displaying instruction for connecting the test leads to each two ground paths connected in series, and for controlling the first circuit for measuring the reflected power of each two ground paths connected in series at the first plurality of frequencies.

38. The apparatus of claim 28 wherein the second circuit and determining means further comprise a microcomputer including a processing means for calculating the ground to earth impedance vector of a first ground path based on the measured reflection coefficient across the test ground path, including the first ground path and a second ground path, in response to the signal being provided across the first ground path and a third ground path connected in series at each of the first plurality of frequencies.

39. A method of measuring ground paths at frequencies above dc comprising:
(a) selecting a first plurality of frequencies within a defined frequency range;
(b) applying a first signal across two ground paths connected in series, at each of the first plurality of frequencies, one frequency at a time;
(c) measuring the reflected power in response to the first signal applied across said two ground paths, at each of the first plurality of frequencies.

40. The method of claim 39 further comprising determining the impedance vector of the ground path in response to the reflected power and the first signal at each of the first plurality of frequencies.

41. The method of claim 40 further comprising:
measuring the reflected power and determining the impedance vector across each two of a first, second, and third ground paths said two ground paths being connected in series, in response to the first signal at each of the first plurality of frequencies; and
determining the ground to earth impedance vector of one of the first, second, and third ground paths at each of the first plurality of frequencies based on the determined impedance vectors across each of said two of the first, second and third ground paths connected in series at each of the first plurality of frequencies.

42. The method of claim 41 further comprising:
determining the ground to earth impedance vector of each of the first, second, and third ground paths at each of the first plurality of frequencies;
comparing the determined ground to earth impedance vectors of the first, second and third ground paths; and
identifying which of the first, second, and third ground paths has the better ground to earth path.

43. The method of claim 41 further comprising identifying any resonance in the determined impedance vector of the one ground path to earth.

44. The method of claim 40 or 41 in which the applying step (b) further comprises providing a pair of test leads for conducting the first signal to two ground paths connected in series, the method further comprising, prior to the applying step (b), calibrating the test leads at each of the first plurality of frequencies so that the impedance of the test leads does not contribute to the determined impedance vector at each of the first plurality of frequencies.

45. The method of claim 41 further comprising:

determining the ground to earth impedance vector of each of the first, second, and third ground paths at each of the first plurality of frequencies;

comparing the determined ground to earth impedance vectors of the first, second and third ground paths; and identifying which of the first, second, and third ground paths has the better ground to earth path.

46. The method of claim 44 further comprising identifying any resonance in the determined impedance vector of the one ground path to earth.

47. The method of claim 40 further comprising displaying at least a portion of the determined impedance vectors.

48. The method of claim 41 further comprising displaying at least a portion the determined ground to earth impedance vector of the one ground path.

49. A method for measuring the impedance vector of a first ground path to earth at frequencies above dc, comprising:

(a) providing a second and a third ground path to earth, the second ground path being terminated between the first and third ground paths;

(b) selecting a first plurality of frequencies;

(c) applying the first signal across a second ground path and a third ground path at each of the first plurality of frequencies, one frequency at a time;

(d) measuring the reflected power across the first and second ground paths in response to each applied first signal; and (e) determining the ground to earth impedance vector of the first ground path to earth at each of the first plurality of frequencies in response to the applied first signal and the measured reflected power at each frequency.

* * * * *

UNITED STATES PATENT AND TRADEMARK OFFICE
CERTIFICATE OF CORRECTION

PATENT NO. : 5,365,179
DATED : November 15, 1994
INVENTOR(S) : Wesley A. Rogers

It is certified that error appears in the above-identified patent and that said Letters Patent is hereby corrected as shown below:

col. 11, line 12 after "increase" delete "the";
col. 11, line 12, after "both" insert --the--;
col. 13, line 38, after "stored" delete "in";
col. 16, line 55-56, delete $$\text{"Re}(Z) = \frac{R_{AC}}{(1-w^2LC)^2 + (wR_{AC}C)^2}\text{"}$$

and insert $$\text{--Re}(Z) = \frac{R_{AC}(1-w^2LC)}{(1-w^2LC)^2 + (wR_{AC}C)^2}\text{--;}$$

col. 17, line 29, delete ", in" and insert --. In--;
col. 24, line 2, after "portion" insert --of--.

Signed and Sealed this

Fifteenth Day of December, 1998

Attest:

BRUCE LEHMAN

Attesting Officer

Commissioner of Patents and Trademarks